(12) United States Patent
Sekine

(10) Patent No.: US 6,438,052 B1
(45) Date of Patent: Aug. 20, 2002

(54) SEMICONDUCTOR MEMORY DEVICE HAVING DUMMY CELLS AROUND MEMORY CELLS FOR SERVING AS COMPENSATING CAPACITOR AND POWER SUPPLY SYSTEM INCORPORATED THEREIN

(75) Inventor: Junichi Sekine, Kanagawa (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/466,539

(22) Filed: Dec. 17, 1999

(30) Foreign Application Priority Data

Dec. 22, 1998  (JP) ............................................. 10-365344

(51) Int. Cl.[7] ................................................. G11C 7/02
(52) U.S. Cl. ........................ 365/210; 365/145; 365/200
(58) Field of Search ................................. 365/210, 200, 365/145, 149, 63, 227

(56) References Cited

U.S. PATENT DOCUMENTS 5,694,353 A * 12/1997 Koike ........................ 365/145
5,910,911 A * 6/1999 Sekiguchi et al. ........... 365/145
5,945,702 A * 8/1999 Nakanishi .................... 257/296
6,246,622 B1 * 6/2001 Sugibayashi ................. 365/210

FOREIGN PATENT DOCUMENTS

JP    61-166066    7/1986    ........... H01L/27/10
JP    61-214559    9/1986    ........... H01L/27/10

* cited by examiner

Primary Examiner—Richard Elms
Assistant Examiner—Hien Nguyen
(74) Attorney, Agent, or Firm—Hayes Soloway P.C.

(57) ABSTRACT

A semiconductor dynamic random access memory device or a ferroelectric random access memory device has dummy cells arranged around memory cells of each array so as to prevent the memory cells from a pattern defect during a fabrication process, and the dummy cells have dummy capacitors connected through a power distributing line to an internal power source so as to render the internal power voltage on the power distributing line stable.

15 Claims, 13 Drawing Sheets

SEMICONDUCTOR MEMORY DEVICE HAVING DUMMY CELLS AROUND MEMORY CELLS FOR SERVING AS COMPENSATING CAPACITOR AND POWER SUPPLY SYSTEM INCORPORATED THEREIN

FIELD OF THE INVENTION

This invention relates to a semiconductor memory device and, more particularly, to a semiconductor memory device of the type storing binary data bits in the form of voltage level such as, for example, a dynamic random access memory device and a ferroelectric random access memory device and a power supply system incorporated therein.

DESCRIPTION OF THE RELATED ART

Various kinds of semiconductor memory devices are known. A semiconductor random access memory device and a semiconductor read only memory device are typical examples, and a wide variety of application has been found. A dynamic random access memory cell and a ferroelectric random access memory cell store binary data bits in the form of potential level. Semiconductor device manufacturers have been requested to increase the data storage capacity of the dynamic random access memory device and the ferroelectric random access memory device without enlargement of the semiconductor chips. The semiconductor device manufacturers integrate circuit components at a high density. The higher the integration density, the lower the production yield. There are various origins of the defective products. One of the origins is a discontinuity of the circuit pattern to be transferred to a photo-sensitive layer spread over the semiconductor wafer. In detail, a defect is less likely to take place in the portion where the circuit pattern is two-dimensionally repeated. However, the circuit pattern is discontinued in the peripheral area of the portion assigned to the memory cell array. The defect is more likely to take place in the peripheral area.

In order to compromise the high integration density and the high production yield, a solution is proposed in Japanese Patent Publication of Unexamined Application No. 61-214559. The solution is to arrange dummy cells around the memory cell array. The dummy cell is not used for storing a data bit, but is formed from the circuit patterns same as those for the memory cells.

FIG. 1 shows a typical example of the semiconductor dynamic random access memory device of the type having the dummy cells. The prior art semiconductor dynamic random access memory device 100 has memory cell arrays 101 arranged in rows and columns, and each of the memory cell arrays 101 is assigned a square area. The square areas are also arranged in rows and columns.

The memory cell arrays 101 are associated with sub-word line driver units 102, and the sub-word line driver units 102 are alternated with the square areas in the direction of row. The memory cell arrays 101 are further associated with sense amplifier units 103, and the sense amplifier units 103 are alternated with the square areas in the direction of column. The sub-word line driver units 102 and the sense amplifier units 103 are abbreviated as "SWD" and "SAMP", respectively.

The rows of memory cell arrays 101 are associated with row address decoder units 104, respectively, and the row address decoder units 104 are operative to selectively make the sub-word line decoder units 102 responsive to row address predecoded signals. The row address decoder units 104 are located on the right sides of the rows of memory cell arrays 101. On the other hand, the columns of memory cell arrays 101 are associated with column address decoder/selector units 105, respectively, and the column address decoder/selector units 105 are located on the lower ends of the columns of memory cell arrays 101. The row address decoder units 104 and the column address selector/decoder units 105 are abbreviated as "XDEC" and "YDEC", respectively.

The row address decoder units 104 and the column address selector/decoder units 105 are connected to peripheral circuits 106, and a power source 107 and input/output circuits (not shown) are examples of the peripheral circuits 106.

FIG. 2 shows one of the memory cell arrays 101, and FIGS. 3, 4 and 5 show different cross sections of the structure of the memory cell array 101. Although first capacitor electrodes 115, a second capacitor electrode 116, sub-word lines 117, bit lines 118 and impurity regions 119 are formed on different levels of the structure (see FIGS. 3 to 5), they are drawn by using real lines, and broken lines are used only for some memory cells 112 and some dummy cells 113 so as to make the memory cells 112 and the dummy cells 113 discriminative from them. The first capacitor electrodes 115 are indicated by hatching lines for the sake of clear discrimination, and mark "x" is indicative of the location of each via-hole formed in inter-level insulating layers. However, the inter-level insulating layers are deleted from the layout shown in FIG. 2.

The square area assigned to each memory cell array 101 is broken down into a central sub-area 110 assigned to the memory cells 112 and peripheral sub-areas 111 assigned to the dummy cells 113. Each of the memory cells 112 are implemented by the combination of a transfer transistor 114 and a storage capacitor, and the first capacitor electrode 115, a dielectric layer (not shown) and a part of the second capacitor electrode 116 form in combination each storage capacitor. The transfer transistor 114 and the storage capacitor constitute each of the dummy cells 113. Thus, the memory cells 112 are identical with the dummy cells 113 as will be described hereinbelow. The impurity regions 119 are arranged in a staggered manner over the square area, and are identical in configuration with one another. Pairs of memory cells 112 are respectively assigned to the impurity regions 119 in the central sub-area 110, and pairs of dummy cells 113 are respectively assigned to the impurity regions 119 in the peripheral sub-areas 111. The sub-word lines 117 extend over the impurity regions 119 in the direction of row, and serve as gate electrodes of the transfer transistors 114. The sub-word lines 117 are connected to the associated sub-word driver units 102. The bit lines 118 extend over the sub-word lines 117 and, accordingly, the impurity regions 119 in the direction of column, and are connected through the via-holes to the associated impurity regions 119 (see FIGS. 3 and 5). The bit lines 118 serve as source electrodes of the transfer transistors 114. The sub-word line 117 is shared between the memory cells 112 and the dummy cells 113 forming parts of the same row. The bit lines 118 for the memory cells 112 are connected to the associated sense amplifier unit 103. However, the bit lines 118 for the dummy cells 113 are connected to a source of ground level.

The impurity region 119 is further connected at both end portions thereof to the first capacitor electrodes 115 through the via-holes. Both end portions of the impurity region 119 serve as drain regions of the transfer transistors 114 of the associated pair. The first capacitor electrodes 115 are higher than the bit lines 118 (see FIG. 4), and are covered with the dielectric layers (not shown). The second capacitor electrode 116 is held in contact with the dielectric layers of the storage capacitors, and is shared between the memory cells 112 and the dummy cells 113 of the memory cell array 101.

The second capacitor electrode 116 is applied with a potential level half as high as the internal power voltage generated by the power source 107. The sub-word line decoder units 102, the sense amplifier units 103, the column address decoder/selector units 105 and the peripheral circuits 106 are powered by the power source 107.

Row addresses are respectively assigned to the sub-word lines 117, and column addresses are respectively assigned to the bit lines 118 associated with the columns of memory cells 112. Thus, each memory cell 112 is selected from the memory cell array 101 by using the combination of the row address and the column address.

When the row address and the column address specify a memory cell 112, the peripheral circuits 106 causes the associated sub-word line driver unit 102 to change a sub-word line 117 to an active level and the column address decoder/selector unit 105 to connect a bit line 118 to the input/output circuit, and makes the associated sense amplifier unit 103 active. The selected sub-word line 117 causes the transfer transistors 114 of the memory cells 112 and the transfer transistors 114 of the dummy cells 113 to turn on, and the storage capacitors are electrically connected through the transfer transistors 114 to the associated bit lines 118. A data bit is read out from the selected memory cell 112 to the selected bit line 118, or is written into the selected memory cell 112. The data bit is propagated on the selected bit line 118 and another bit line 118 paired therewith in the form of potential difference, and the sense amplifier unit 103 increases the magnitude of each potential difference. Thus, the data bits are read out from or written into the memory cells 112 connected to the selected sub-word line 117. However, any data bit is read out from the dummy cells 113.

As will be understood, the pattern of impurity regions 119 and the patterns of layers 115/117/118 are repeated from the central sub-area 110 assigned to the memory cells 112 to the peripheral sub-areas 111 assigned to the dummy cells 113 without any discontinuity, and the repetition over the boundaries between the central sub-area 110 to the peripheral sub-areas 111 is effective against the defects. For this reason, the production yield is improved.

A problem is encountered in the prior art semiconductor memory device in that the internal power voltage fluctuates due to the activation of the circuits 102–106 as shown in FIG. 6. The voltage fluctuation is causative of undesirable inversion of data bit. A compensating capacitor 120 is effective against the voltage fluctuation. The compensating capacitor 120 is connected to a power supply line between the power source 107 and the other circuits 102 to 106 as shown in FIG. 7. In the prior art semiconductor memory device, the compensating capacitor 120 is provided under the bus lines among the peripheral circuits 106.

If the compensating capacitor 120 is too small to prevent the internal power voltage from the voltage fluctuation, the semiconductor memory device still suffers from the undesirable inversion of data bit. On the other hand, if a large compensating capacitor 120 is large enough to prevent the internal power voltage from the voltage fluctuation, the compensating capacitor 120 occupies an area wider than that assigned to the peripheral circuits 106, and a large semiconductor chip is required for the semiconductor memory device. Thus, there is a trade-off between the effect against the voltage fluctuation and the size of the compensating capacitor 120.

Moreover, the compensating capacitor 120 under the peripheral circuits 106 is less effective against the voltage fluctuation due to the circuits 102 to 106 incorporated in the memory cell array 101. The closer the compensating capacitor 120 to an origin of the voltage fluctuation, the stronger the effect. From this aspect, the compensating capacitor 120 incorporated in the prior art semiconductor memory device is effective against the voltage fluctuation due to the activation of the peripheral circuits 106, but is less effective against the voltage fluctuation due to the circuits 102 to 106 incorporated in the memory cell arrays 101.

SUMMARY OF THE INVENTION

It is therefore an important object of the present invention to provide a semiconductor memory device, a compensating capacitor of which is effective against voltage fluctuation due to an activation of circuits incorporated in a memory cell array.

It is also another important object of the present invention to provide an internal power supply system appropriate for the semiconductor memory device from voltage fluctuation.

To accomplish the object, the present invention proposes to use the storage capacitors of dummy cells as a compensating capacitor against voltage fluctuation on a power distribution line.

In accordance with one aspect of the present invention, there is provided a semiconductor memory device fabricated on a semiconductor substrate comprising plural memory cells arranged in a first area of a major surface of the semiconductor substrate in a certain geometric pattern for storing binary data bits in a readable and rewritable manner, plural dummy cells arranged in second areas of the major surface contiguous to the first area so as to render the certain geometric pattern continued from the first area to the second areas and having a capacitance, electric circuits associated with the plural memory cells so as to write binary data bits into and read out the binary data bits therefrom and an internal power source distributing an internal power voltage to the electric circuits and connected to at least selected ones of the plural dummy cells so as to couple at least a part of said capacitance to the internal power source, thereby rendering the internal power voltage stable.

In accordance with another aspect of the present invention, there is provided a power distributing system incorporated in a semiconductor memory device comprising an internal power source supplied with an external voltage for producing an internal power voltage, a power distributing line connected to the internal power source and electric circuits of the semiconductor memory device for supplying the internal power voltage to the electric circuits and a compensating capacitor including capacitors of dummy cells arranged outside of an area assigned to memory cells in a geometric pattern continued from the area and connected to the power distributing line so as render the internal power voltage on the power distributing line stable.

BRIEF DESCRIPTION OF THE DRAWINGS

The features and advantages of the semiconductor memory device will be more clearly understood from the following description taken in conjunction with the accompanying drawings in which.

DESCRIPTION OF THE PREFERRED EMBODIMENTS

First Embodiment

Figure 1:
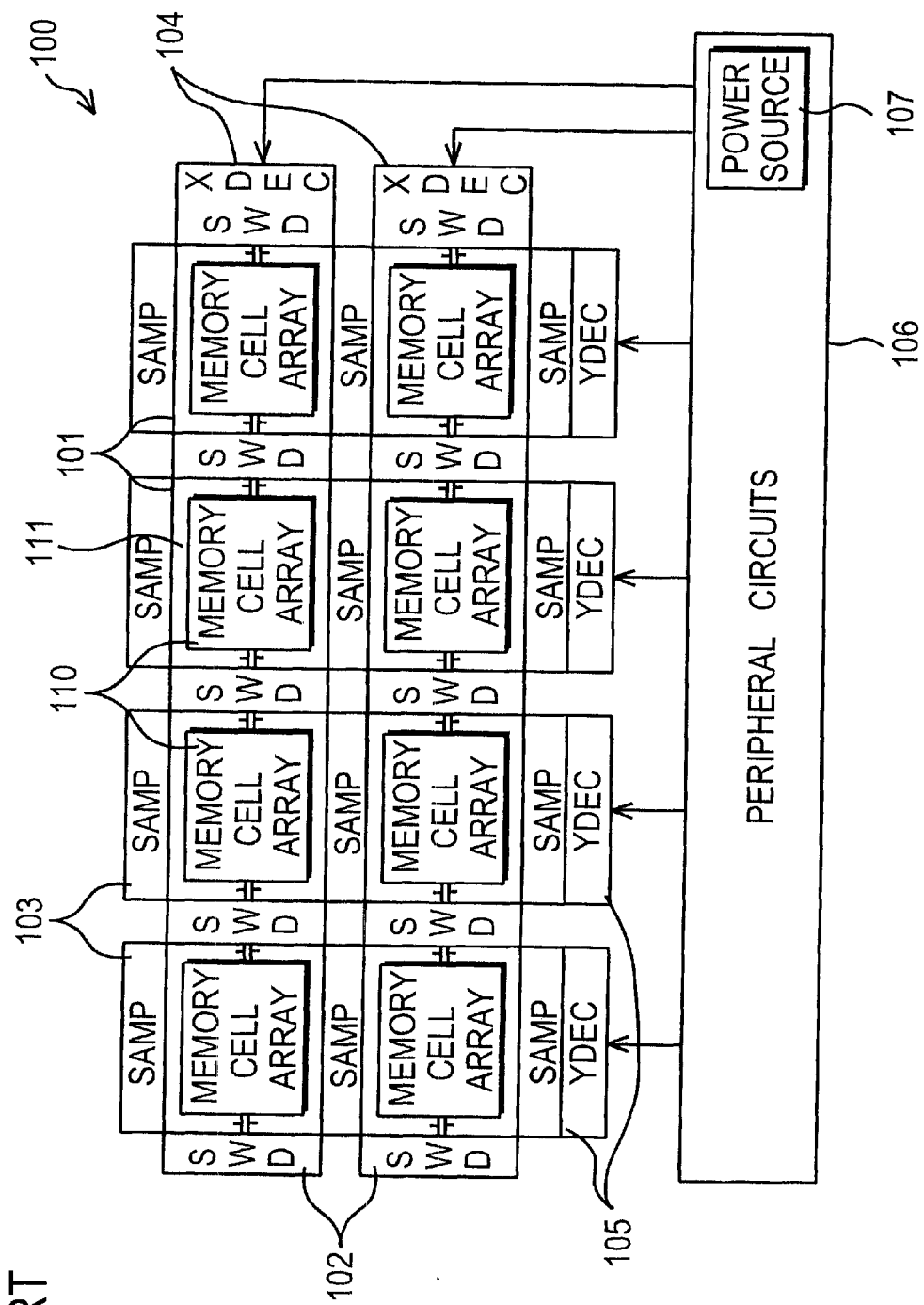
FIG. 1 is a block diagram showing the circuit arrangement of the prior art semiconductor memory device.
Figure 2:
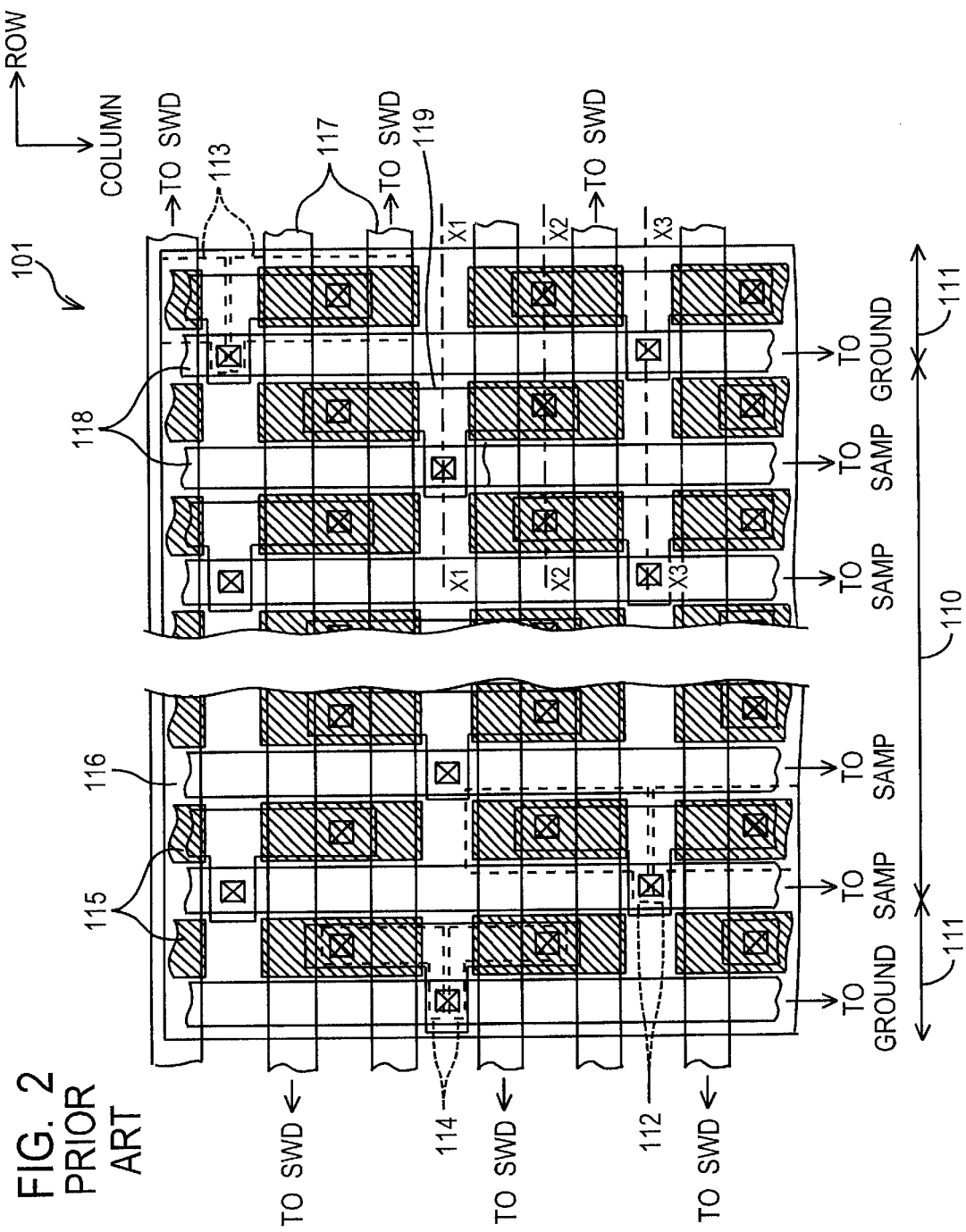
FIG. 2 is a plan view showing the layout of the memory cell array incorporated in the prior art semiconductor memory device.
Figure 3:
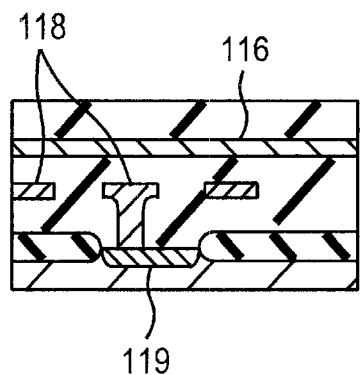
FIG. 3 is a cross sectional view taken along line X1—X1 in FIG. 2 and showing the structure of the memory cell array.
Figure 4:
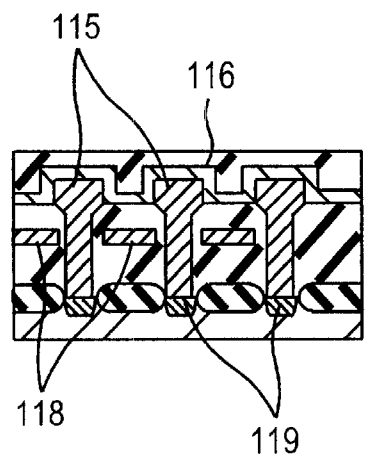
FIG. 4 is a cross sectional view taken along line X2—X2 in FIG. 2 and showing the structure of the memory cell array.
Figure 5:
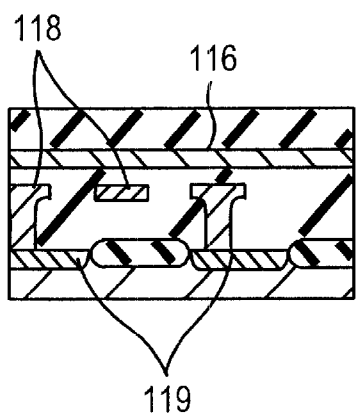
FIG. 5 is a cross sectional view taken along line X3—X3—in FIG. 2 and showing the structure of the memory cell array.
Figure 6:
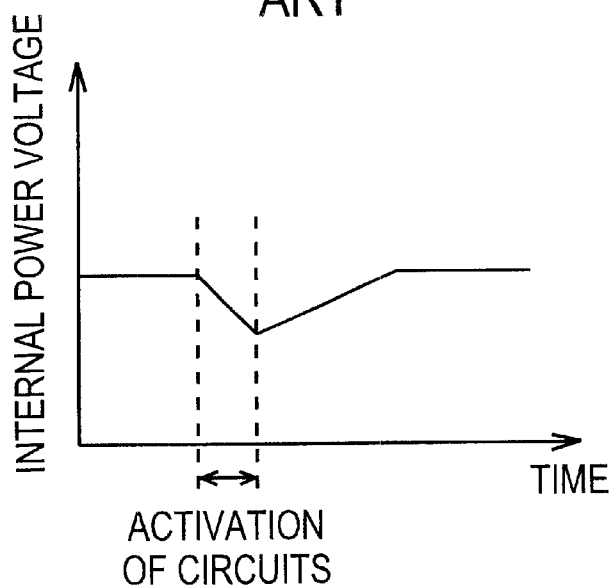
FIG. 6 is a graph showing the fluctuation of the internal power voltage.
Figure 7:
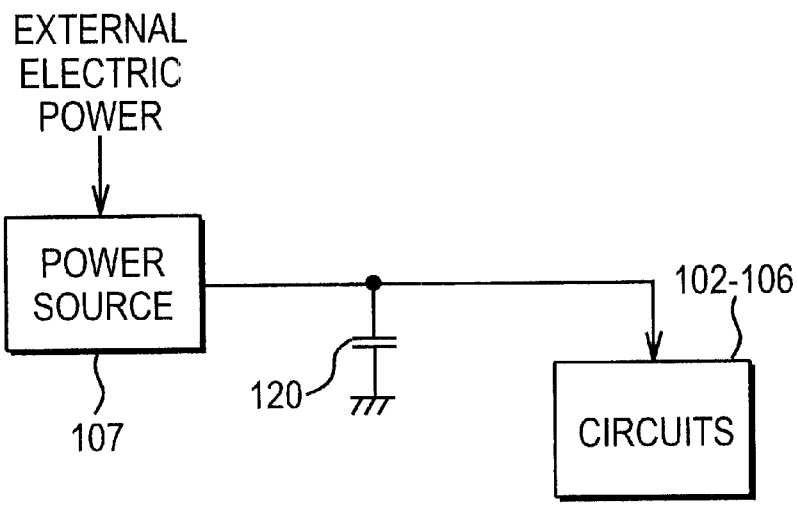
FIG. 7 is a block diagram showing the voltage compensator added to the power source incorporated in the prior art semiconductor memory device.
Figure 8:
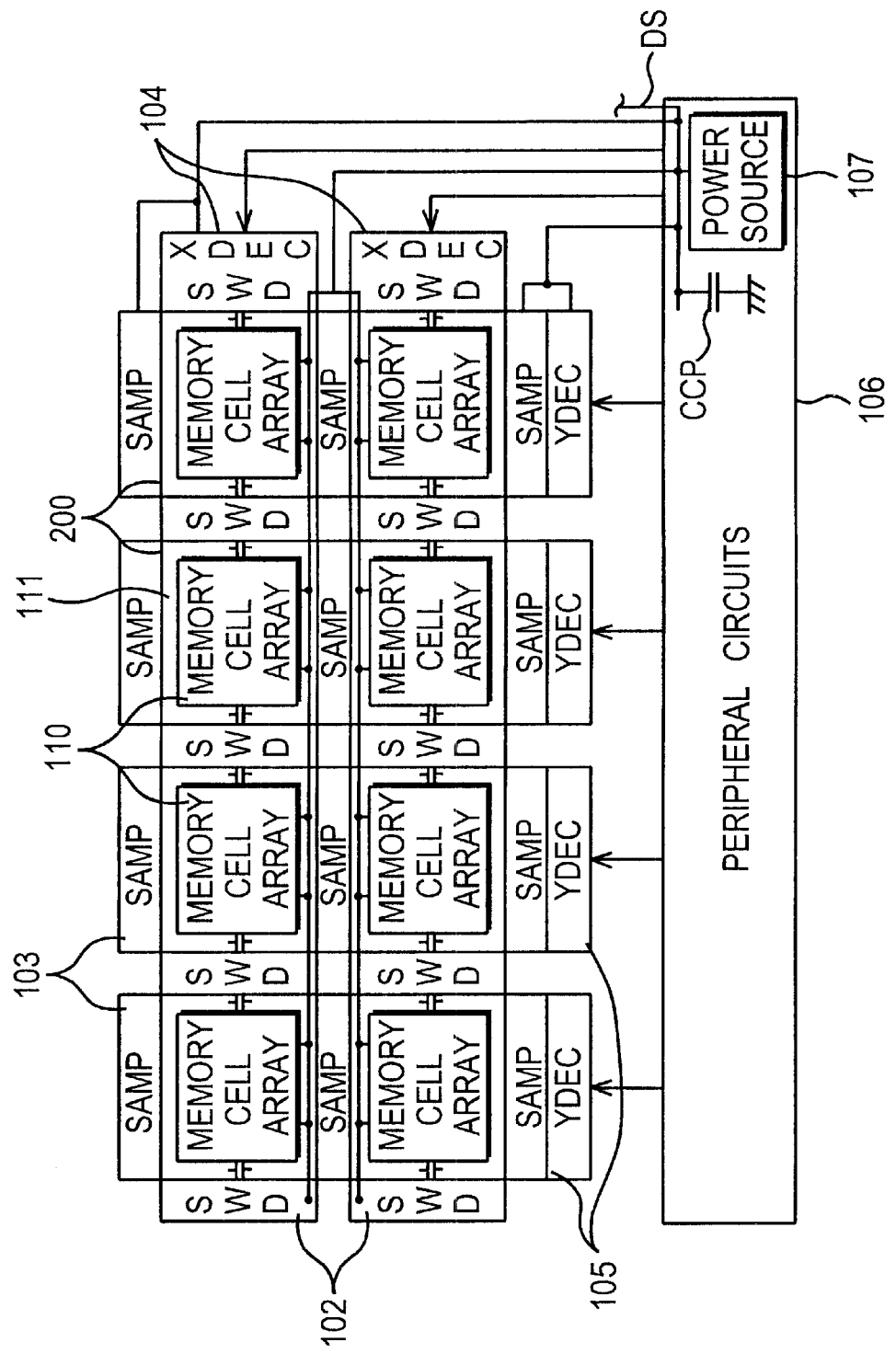
FIG. 8 is a block diagram showing the circuit arrangement of a semiconductor dynamic random access memory device according to the present invention.

Referring to FIG. 8 of the drawings, plural memory cell arrays 200 are incorporated in a semiconductor dynamic random access memory device embodying the present invention, and are arranged in rows and columns on a semiconductor substrate. Each of the memory cell arrays 200 is assigned a square area, and, accordingly, the square areas are arranged in rows and columns on the semiconductor substrate.

The memory cell arrays 200 are associated with sub-word line driver units 102, and the sub-word line driver units 102 are alternated with the square areas in the direction of row. The memory cell arrays 200 are further associated with sense amplifier units 103, and the sense amplifier units 103 are alternated with the square areas in the direction of column. The sub-word line driver units 102 and the sense amplifier units 103 are abbreviated as "SWD" and "SAMP", respectively, and are kinds of active circuits.

The rows of memory cell arrays 200 are associated with row address decoder units 104, respectively, and the row address decoder units 104 are operative to selectively make the sub-word line decoder units 102 responsive to row address predecoded signals. The row address decoder units 104 are located on the right sides of the rows of memory cell arrays 200. On the other hand, the columns of memory cell arrays 200 are associated with column address decoder/selector units 105, respectively, and the column address decoder/selector units 105 are located on the lower ends of the columns of memory cell arrays 200. The row address decoder units 104 and the column address selector/decoder units 105 are abbreviated as "XDEC" and "YDEC", respectively, and are other kinds of active circuit.

The row address decoder units 104 and the column address selector/decoder units 105 are connected to peripheral circuits 106. A power source 107 and input/output circuits (not shown) are examples of the peripheral circuits 106. The power source 107 distributes internal power voltage through power distribution lines DS to other peripheral circuits, the sub-word line driver units 102, the sense amplifier units 103 and the column address decoder/selector units 105. The power distribution line DS is further connected to storage capacitors of dummy cells incorporated in the memory cell arrays 200 as will be hereinbelow described in detail. A compensating capacitor CCP is formed in the area assigned to the peripheral circuits 106, and is also connected between the distributing line DS and a ground line.

Figure 9:
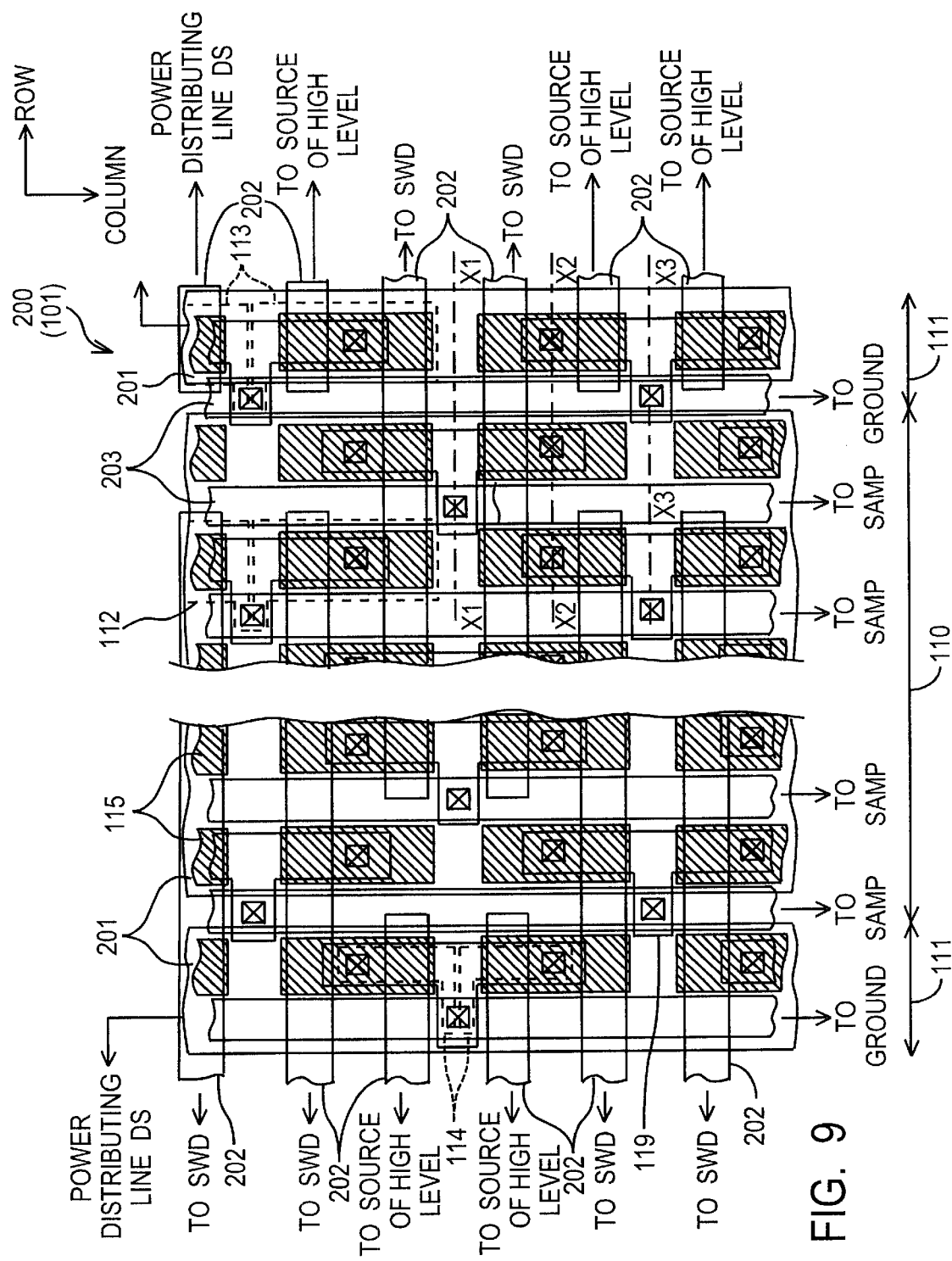
FIG. 9 is a plan view showing the layout of a memory cell array incorporated in the semiconductor dynamic random access memory device.
Figure 10:
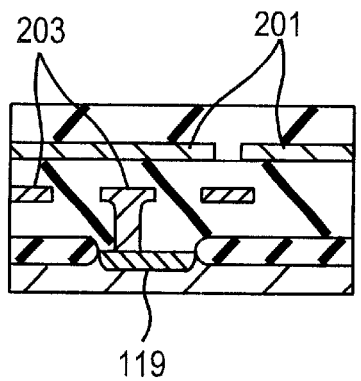
FIG. 10 is a cross sectional view taken along line X1—X1 in FIG. 9 and showing the structure of the memory cell array.
Figure 11:
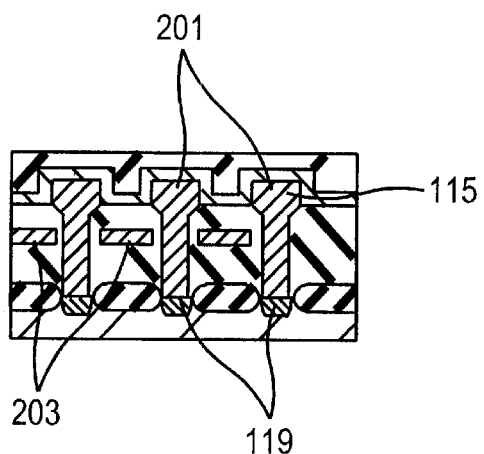
FIG. 11 is a cross sectional view taken along line X2—X2 in FIG. 9 and showing the structure of the memory cell array.
Figure 12:
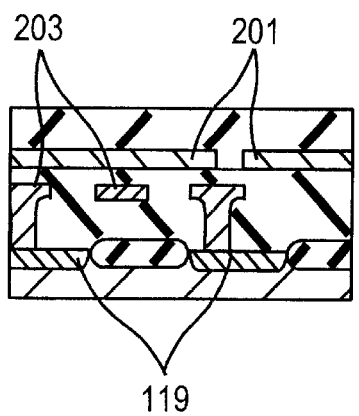
FIG. 12 is a cross sectional view taken along line X3—X3—in FIG. 9 and showing the structure of the memory cell array.

FIG. 9 shows one of the memory cell arrays 200, and FIGS. 10, 11 and 12 show different cross sections of the structure of the memory cell array 200. Although first capacitor electrodes 115, second capacitor electrodes 201, sub-word lines 202, bit lines 203 and impurity regions 119 are formed on different levels of the structure (see FIGS. 10 to 12), they are drawn by using real lines, and broken lines are used only for some memory cells 112 and some dummy cells 113 so as to make the memory cells 112 and the dummy cells 113 discriminative from others. The first capacitor electrodes 115 are indicated by hatching lines for the sake of clear discrimination, and mark "x" is indicative of the location of each via-hole formed in inter-level insulating layers. However, the inter-level insulating layers are deleted from the layout shown in FIG. 9.

The square are a assigned to each memory cell array 200 is broken down into a central sub-area 110 assigned to the memory cells 112 and peripheral sub-areas 111 assigned to the dummy cells 113. Though not shown in FIG. 9, other peripheral sub-areas 111 are further provided on both ends of the central sub-area 110, and other dummy cells 113 are formed in the other peripheral sub-areas 111.

Figure 13:
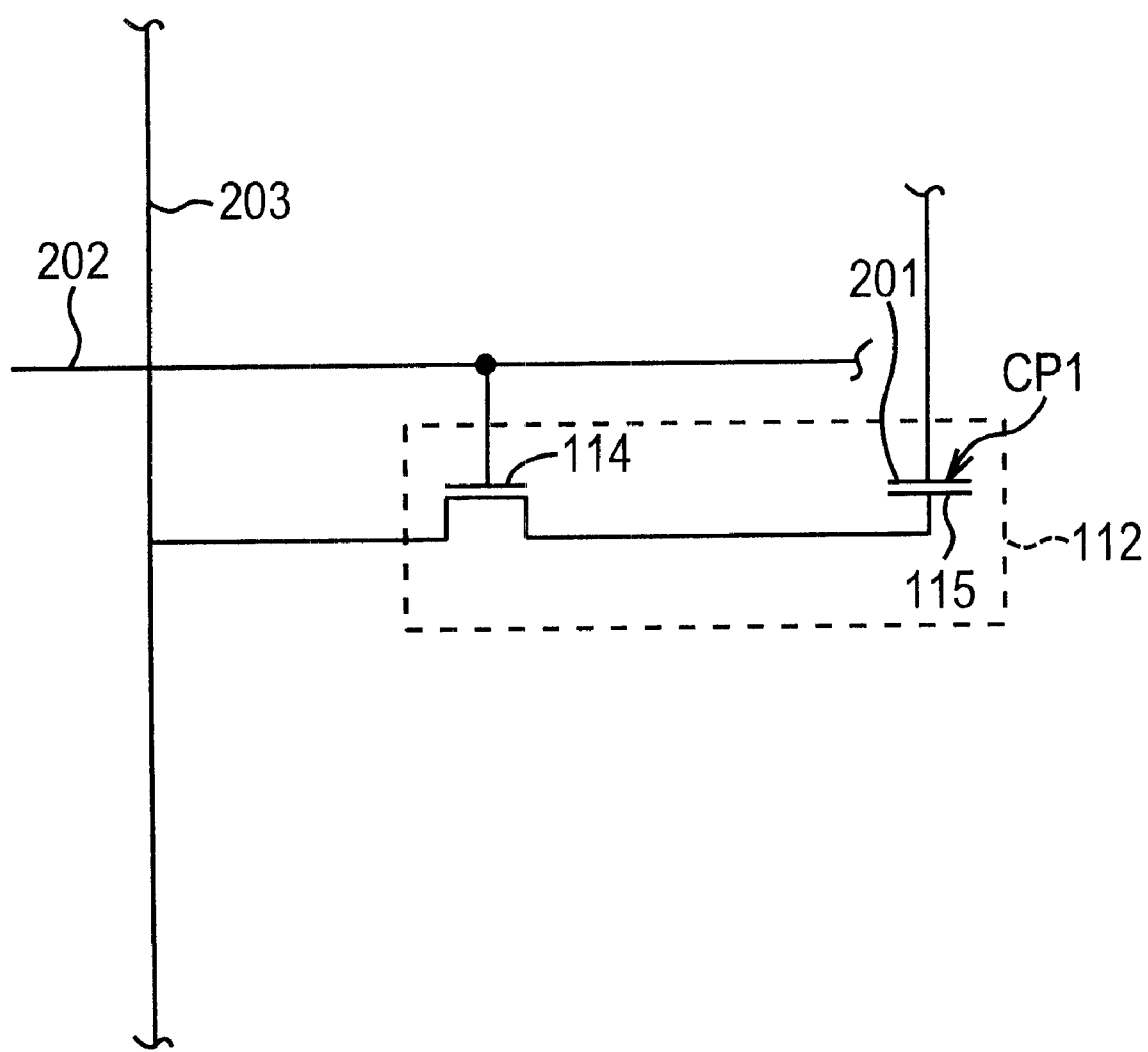
FIG. 13 is a circuit diagram showing the equivalent circuit of a memory cell incorporated in the semiconductor dynamic random access memory device.
Figure 14:
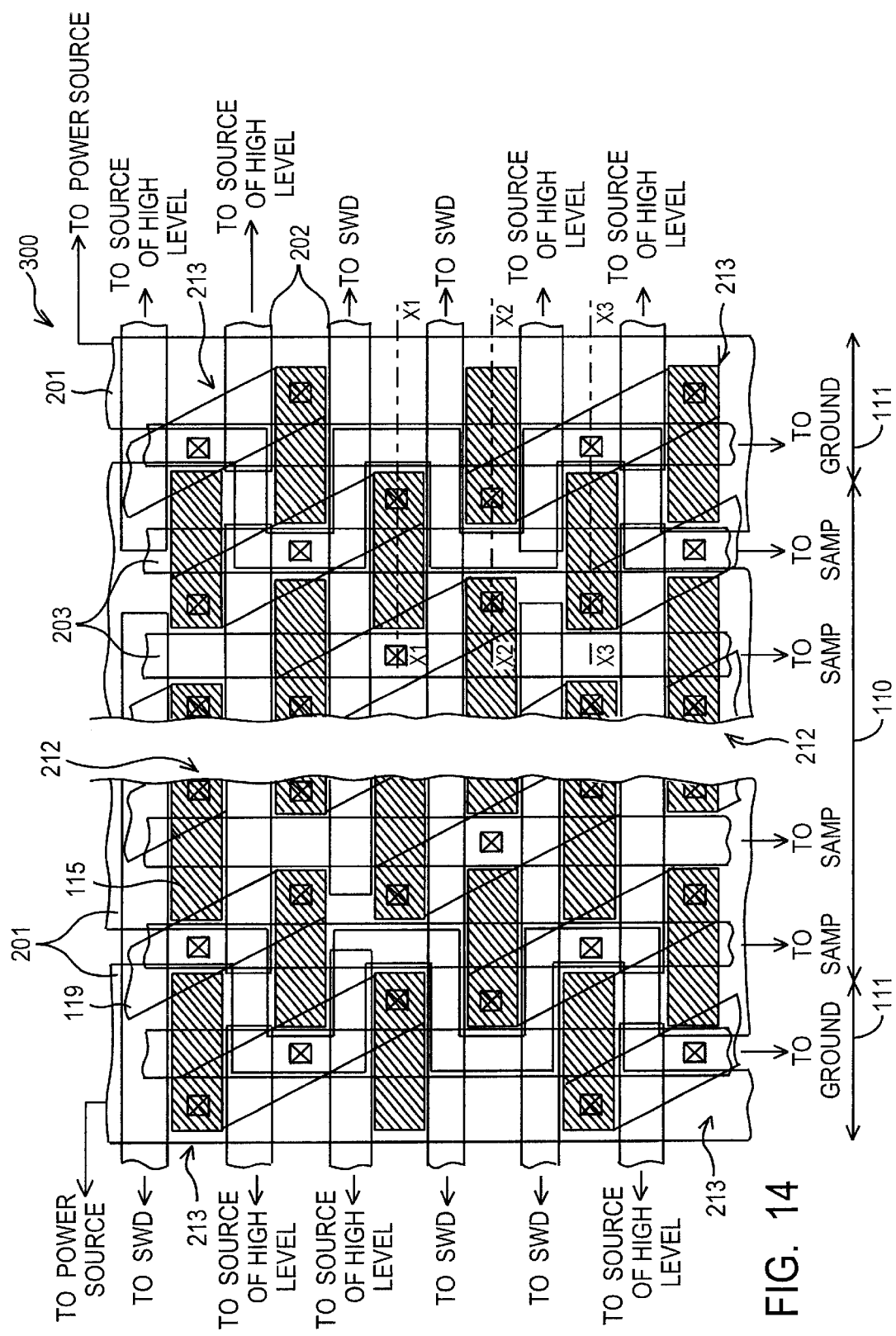
FIG. 14 is a plan view showing the layout of a memory cell array incorporated in another semiconductor dynamic random access memory device according to the present invention.
Figure 15:
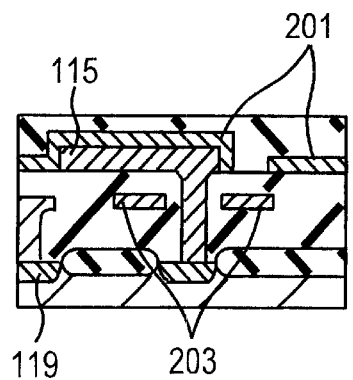
FIG. 15 is a cross sectional view taken along line X1—X1 in FIG. 14 and showing the structure of the memory cell array.
Figure 16:
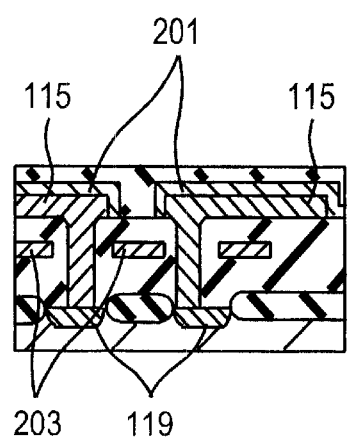
FIG. 16 is a cross sectional view taken along line X2—X2 in FIG. 14 and showing the structure of the memory cell array.
Figure 17:
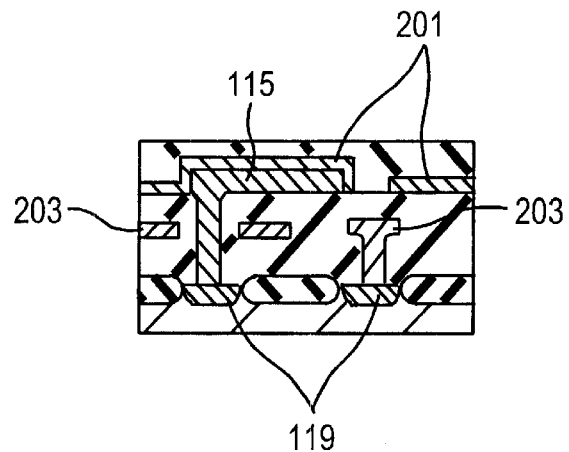
FIG. 17 is a cross sectional view taken along line X3—X3—in FIG. 14 and showing the structure of the memory cell array.

Each of the memory cells 112 are implemented by the combination of a transfer transistor 114 and a storage capacitor CP1 (see FIG. 13), and the first capacitor electrode 115, a dielectric layer and a part of the second capacitor electrode 201 form in combination the storage capacitor CP1. The transfer transistor 114 and the storage capacitor CP1 also constitute each of the dummy cells 113. The electrical connection to the second capacitor electrodes 201 is different between the memory cells 112 and the dummy memory cells 113 as described hereinlater in detail.

The impurity regions 119 are arranged in a staggered manner over the square area, and are identical in configuration with one another. Pairs of memory cells 112 are respectively assigned to the impurity regions 119 in the central sub-area 110, and pairs of dummy cells 113 are respectively assigned to the impurity regions 119 in the peripheral sub-areas 111. The sub-word lines 202 extend over the impurity regions 119 in the direction of row, and serve as gate electrodes of the transfer transistors 114. The sub-word lines 202 are selectively connected to the associated sub-word driver units 102 and a source of high voltage level. In FIG. 9, the first sub-word line 202, the second sub-word line 202, the fifth sub-word line 202 and the sixth sub-word line 202 are broken into left parts and right parts. The left parts extend over the left peripheral sub-area 111 and the central sub-area 110, and the right parts extend over the right peripheral sub-area 111. The left parts are connected to the associated sub-word driver units 102, and the sub-word driver units 102 selectively changes the left parts to an active high level. However, the right parts are applied with the active high level at all times, and keep the transfer transistors 114 of the associated dummy cells 113 in the right peripheral sub-area 111 in on-state.

The third sub-word line 202 and the fourth sub-word line 202 are also divided into left parts and the right parts. The left parts extend over the left peripheral sub-area 111, and the right parts extend over the central sub-area 110 and the right peripheral sub-area 111. The right parts are connected to the sub-word driver unit 102, and the sub-word driver unit 102 selectively changes the right parts to the active high level. The active high level is applied to the left parts, and causes the transfer transistors of the dummy cells 113 in the left peripheral sub-area 111 to turn on at all times. The bit lines 203 extend over the sub-word lines 202 and, accordingly, the impurity regions 119 in the direction of column, and are connected through the via-holes to the associated impurity regions 119 (see FIGS. 10 and 12). The bit lines 203 serve as source electrodes of the transfer transistors 114. The bit lines 203 for the memory cells 112 are connected to the associated sense amplifier unit 103. However, the bit lines 203 for the dummy cells 113 are connected to a source of ground level.

The impurity region 119 is further connected at both end portions thereof to the first capacitor electrodes 115 through the via-holes. Both end portions of the impurity region 119 serve as drain regions of the transfer transistors 114 of the associated pair. The first capacitor electrodes 115 are higher than the bit lines 203 (see FIG. 11), and are covered with the dielectric layers. Three second capacitor electrodes 201 are associated with each memory cell array 200. Two second capacitor electrodes 201 are located over the peripheral sub-areas 111 and are held in contact with the dielectric layers of the storage capacitors CP1 incorporated in the dummy cells 113, and the remaining second capacitor electrode 201 is located over the central sub-area 110, and are held in contact with the dielectric layers of the storage capacitors CP1 incorporated in the memory cells 112.

The second capacitor electrode 201 over the central sub-area 110 is applied with a potential level half as high as the internal power voltage generated by the power source 107. The other second capacitor electrodes 201 over the peripheral sub-areas 111 are connected to the power distributing line DS.

A data access to the memory cells 112 is similar to the data access in the prior art dynamic random access memory device, and no further description is hereinbelow incorporated.

The dummy cells 113 prevent the cell pattern from a discontinuity at the outermost memory cells 112, and are effective against the pattern defects. The storage capacitors CP1 of the selected dummy cells 113 are connected between the power distributing line DS and the ground line, and form in combination another compensating capacitor. Thus, the semiconductor dynamic random access memory device according to the present invention has two compensating capacitors one of which is formed in the area assigned to the peripheral circuits 106 and the other of which is implemented by the storage capacitors CP1 of the dummy cells 113. The compensating capacitor CCP is close to the peripheral circuits 116, and prevents the internal power voltage from the voltage fluctuation due to the activation of the peripheral circuits 116. On the other hand, the storage capacitors CP1 of the dummy cells 113 are close to the circuits 102, 103 and 105, and prevent the internal power voltage from the fluctuation due to the activation of those circuits. Thus, the compensating capacitor CCP cooperates with the compensating capacitors CP1 of the dummy cells 113. It is not necessary for the semiconductor dynamic random access memory device to have a large compensating capacitor in the area assigned to the peripheral circuits 106. For this reason, the compensating capacitor CCP merely occupies narrow area, and does not make the semiconductor chip large. In this instance, the dummy cells 113 in the peripheral sub-areas 111 on both sides of the memory cells provide the storage capacitors CP1 for the compensating capacitor, because the arrangement of the sub-word lines 202 are simple.

When the memory cell 112 is accessed, the associated row address decoder unit 104, the associated sub-word driver units 102, the associated column address decoder/selector unit 105 and the associated sense amplifier unit 103 are sequentially activated with the internal power voltage, and a large amount of electric current is consumed. However, the storage capacitors CP1 of the dummy cells 113 are close to those circuits 102, 103, 104 and 105, and effectively take up the voltage fluctuation. Thus, the storage capacitors CP1 of the dummy cells 113 keep the internal voltage level constant, and the data access proceeds without any malfunction due to the voltage fluctuation.

As will be understood from the foregoing description, the storage capacitors CP1 of the dummy cells 113 are used as the compensating capacitor against the voltage fluctuation on the power distributing line DS, and the circuits 102 to 105 are prevented from the voltage fluctuation. The dummy cells 113 have been already incorporated in the prior art semiconductor dynamic random access memory device, and have prevented the memory cells 112 from undesirable pattern defects. For this reason, any new compensating capacitor is not required for the prevention against the voltage fluctuation.

Second Embodiment

FIGS. 14, 15, 16 and 17 show a memory cell array 300 incorporated in another semiconductor dynamic random access memory device embodying the present invention.

The semiconductor dynamic random access memory device implementing the second embodiment is different from the configuration of impurity regions 119 for memory/dummy cells 212/213 from the first embodiment. For this reason, other layers and regions of the second embodiment are labeled with the same references designating corresponding layers and regions of the first embodiment without detailed description.

The central sub-are 110 is assigned to the memory cells 212, and the peripheral sub-areas 111 are assigned to the dummy cells 213. The memory cells 212 are same in structure as the dummy cells 213, and the dummy cells 213 prevent the memory cells 212 from a discontinuity of the circuit pattern at the outermost cells 212. The impurity regions 119 are obliquely elongated with respect to the sub-word lines 202 and the bit lines 203, and the memory/dummy cells 212/213 are arranged in the square area at a high density. The memory/dummy cell 212/213 is implemented by the series combination of the transfer transistor 114 and the storage capacitor as similar to the memory/dummy cell 112/113.

Three second capacitor electrodes 201 are incorporated in the memory cell array 300, and the second capacitor electrode 201 over the central sub-area 110 is connected to the source of potential level half as high as the internal power voltage. However, the other capacitor electrodes 201 over the peripheral sub-areas 111 are connected to the power distribution line DS, and the storage capacitors of the dummy cells 213 serve as a compensating capacitor against voltage fluctuation on the power distribution line DS.

The semiconductor dynamic random access memory device implementing the second embodiment achieves all the advantages of the first embodiment.

Third Embodiment

Figure 18:
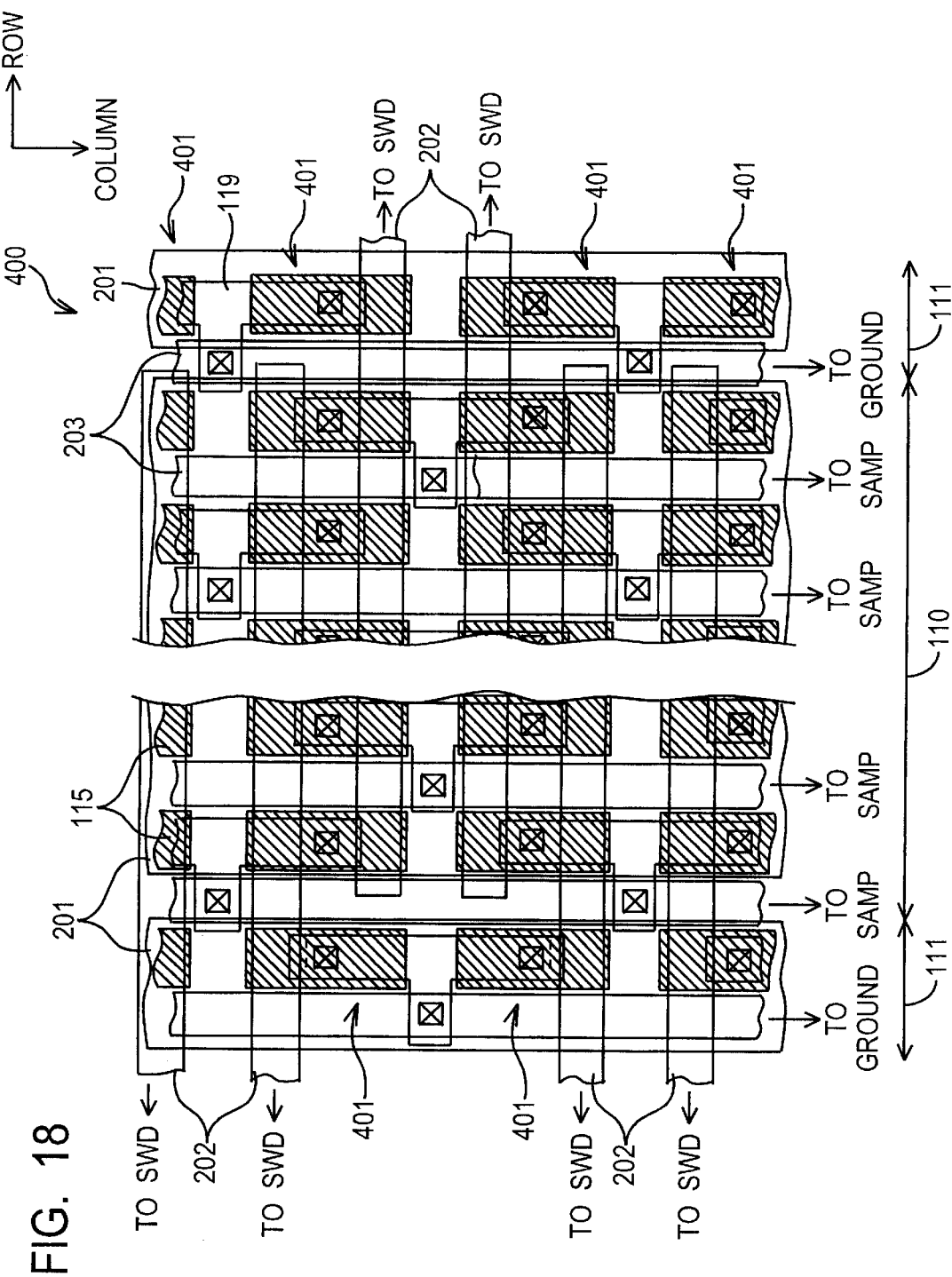
FIG. 18 is a plan view showing the layout of a memory cell array incorporated in yet another semiconductor dynamic random access memory device according to the present invention.

FIG. 18 illustrates the layout of a memory cell array 400 incorporated in yet another semiconductor dynamic random access memory device embodying the present invention. The semiconductor dynamic random access memory device implementing the third embodiment is similar to the first embodiment except the transfer transistors 401 of the dummy cells. For this reason, other regions and layers are labeled with the same references designating corresponding regions and layers of the first embodiment without detailed description.

The transfer transistors 401 are of the depletion type, and the sub-word lines 202 do not extend over the transfer transistors 401. The transfer transistors 401 are turned on at all times, and the bit lines 203 associated with the dummy cells are electrically connected to the first capacitor electrodes 115 of the storage capacitors incorporated in the dummy cells. The second capacitor electrode 201 over the central sub-area 110 is applied with the potential level half as large as the internal power voltage, and the other capacitor electrodes 201 over the peripheral sub-areas 111 are connected to the distribution line DS. The storage capacitors of the dummy cells serve as a compensating capacitor against the voltage fluctuation on the distribution line DS.

The depletion type transfer transistors 401 do not consume any electric power, and the semiconductor dynamic random access memory device implementing the third embodiment is desirable from the viewpoint of power saving. However, the process sequence is complicated rather than that of the first embodiment.

Fourth Embodiment

Figure 19:
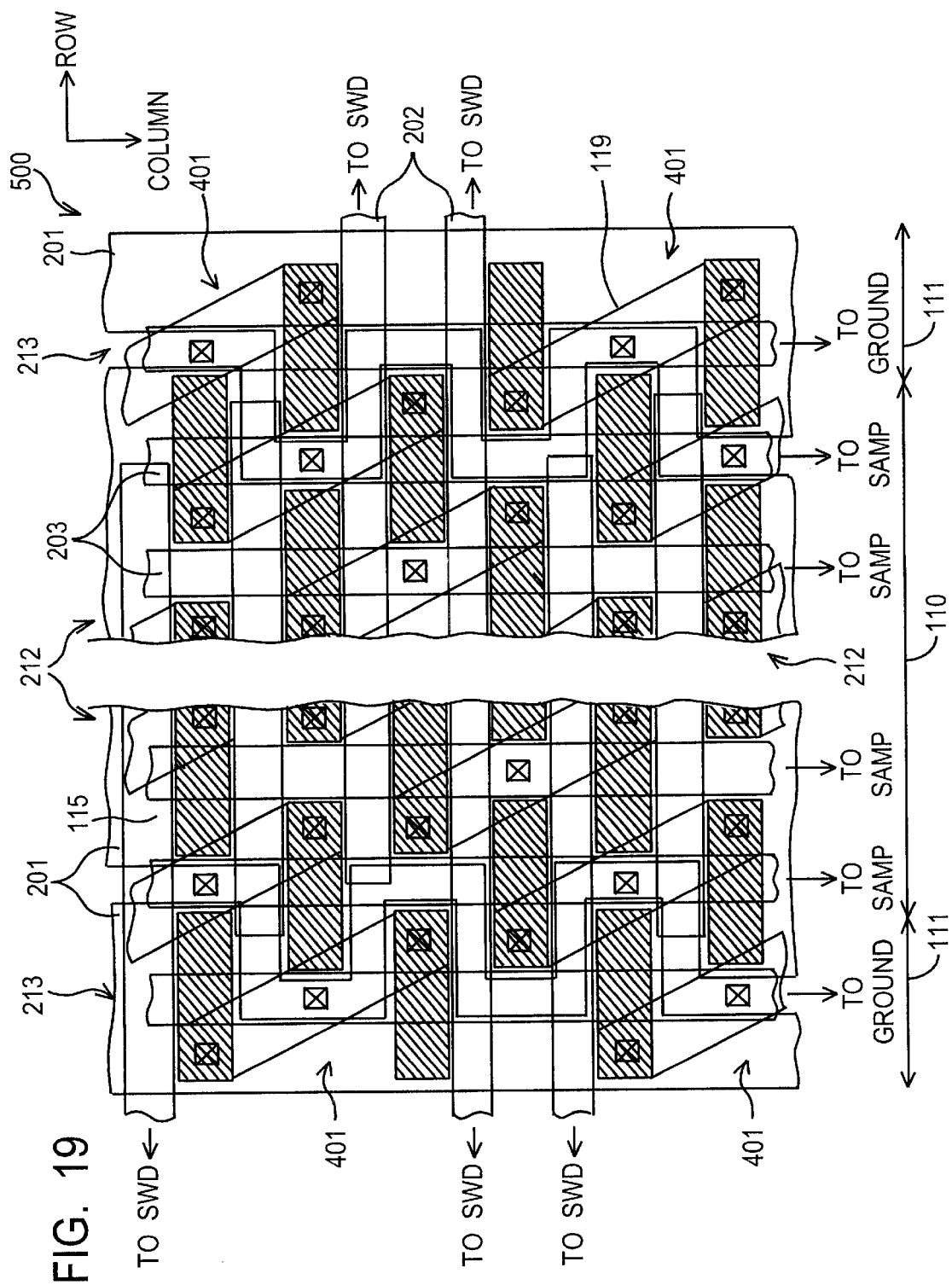
FIG. 19 is a plan view showing the layout of a memory cell array incorporated in still another semiconductor dynamic random access memory device according to the present invention.

FIG. 19 illustrates show a memory cell array 500 incorporated in still another semiconductor dynamic random access memory device embodying the present invention. The semiconductor dynamic random access memory device implementing the fourth embodiment is different from the configuration of impurity regions 119 for memory/dummy cells 212/213 from the third embodiment. For this reason, other layers and regions of the second embodiment are labeled with the same references designating corresponding layers and regions of the third embodiment without detailed description.

The central sub-are 110 is assigned to the memory cells 212, and the peripheral sub-areas 111 are assigned to the dummy cells 213. The memory cells 212 are same in structure as the dummy cells 213, and the dummy cells 213 prevent the memory cells 212 from a discontinuity of the circuit pattern at the outermost cells 212. The impurity regions 119 are obliquely elongated with respect to the sub-word lines 202 and the bit lines 203, and the memory/dummy cells 212/213 are arranged in the square area at a high density. The memory cell 212 is implemented by the series combination of the enhancement type transfer transistor 114 and the storage capacitor. On the other hand, the series combination of the depletion type transfer transistor 401 and the storage capacitor forms the dummy cell 213.

Three second capacitor electrodes 201 are incorporated in the memory cell array 500, and the second capacitor electrode 201 over the central sub-area 110 is connected to the source of potential level half as high as the internal power voltage. The other capacitor electrodes 201 over the peripheral sub-areas 111 are connected to the power distribution line DS, and the storage capacitors of the dummy cells 213 serve as a compensating capacitor against voltage fluctuation on the power distribution line DS.

The semiconductor dynamic random access memory device implementing the fourth embodiment achieves both of the advantages of the second and third embodiments.

As will be appreciated from the foregoing description, the semiconductor memory device according to the present invention has the dummy cells, which not only prevent the memory cells from pattern defects due to the pattern discontinuity but also provide the compensating capacitor against the voltage fluctuation on the internal power distribution line. The dummy memory cells are so many that the compensating capacitor is effective against the voltage fluctuation. Moreover, the compensating capacitor is close to the circuits 102 to 105, and enhances the stability of those circuits 102 to 105. The other compensating capacitor CCP is not expected to eliminate the voltage fluctuation due to the activation of the circuits 102 to 105, and a large amount of capacitance is not required. The manufacturer reduces the compensating capacitor CCP, and the area assigned to the peripheral circuits 106 becomes narrow. The dummy cells have been already incorporated in the semiconductor dynamic random access memory device for preventing the memory cells from the pattern defects. The present inventor gives another task, i.e., the compensating capacitor against the voltage fluctuation on the internal power distribution line to the dummy cells. Thus, the compensating capacitor according to the present invention does not make the semiconductor chip enlarged.

In the above-described embodiments, the sub-word driver units 102, the sense amplifier units 103, the row address decoder units 104, the column address decoder selector units 105 and the peripheral circuits 106 serve as electric circuits.

Although particular embodiments of the present invention have been shown and described, it will be apparent to those skilled in the art that various changes and modifications may be made without departing from the spirit and scope of the present invention. For example, only the storage capacitors CP1 of the dummy cells 113 may serve as the compensating capacitor against the voltage fluctuation.

The dummy cells 113 in the other peripheral sub-areas 111 located on both ends of the bit lines 203 may provide the storage capacitors CP1 for the compensating capacitor coupled to the distribution line DS.

Figure 20:
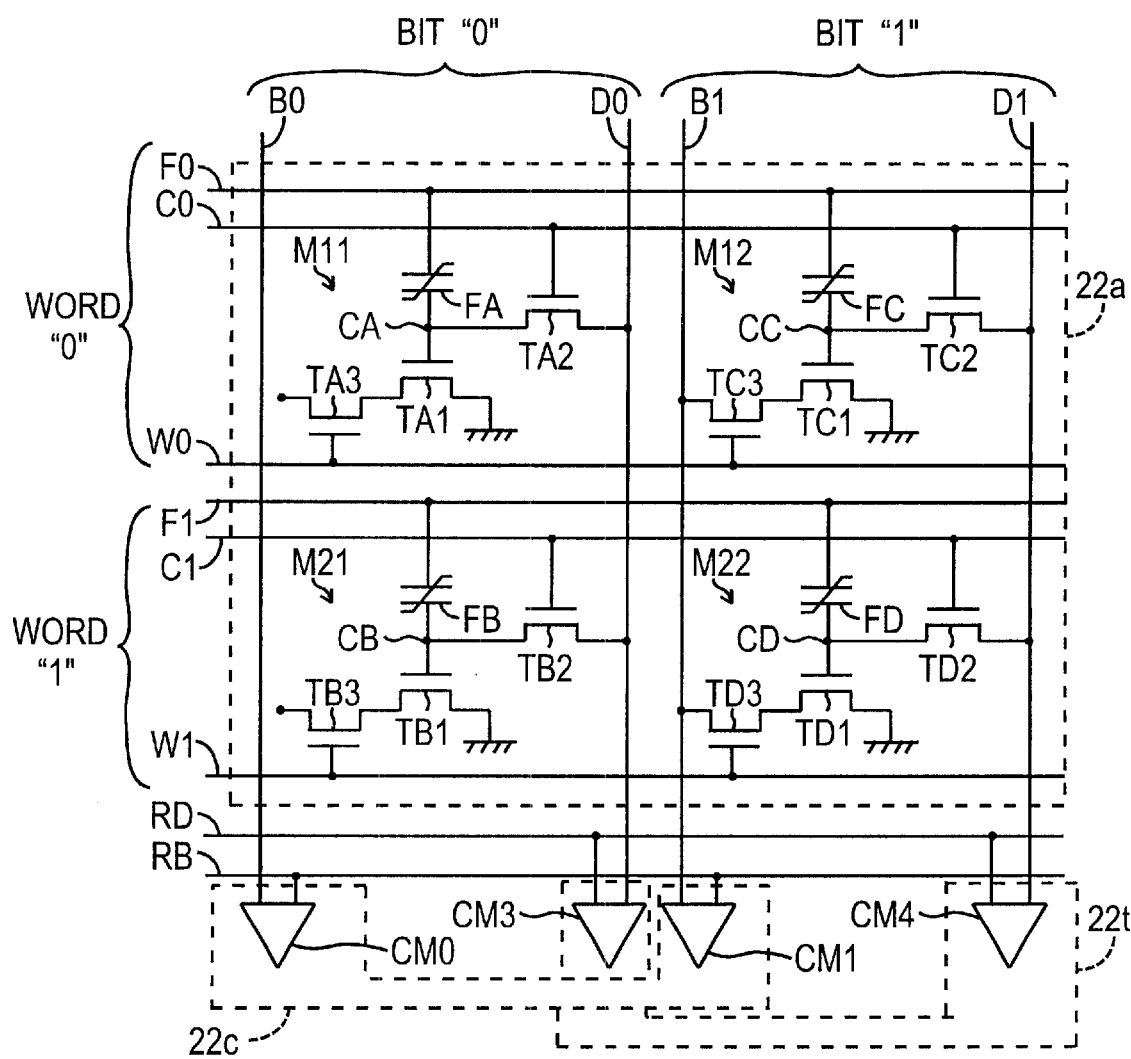
FIG. 20 is a circuit diagram showing the equivalent circuit of a memory cell incorporated in a ferroelectric random access memory device according to the present invention.

The present invention is applicable to any kind of semiconductor memory device of the type storing data bits in capacitors. A ferroelectric random access memory device is another kind of semiconductor memory device of the type storing data bits in capacitors. The ferroelectric random access memory device is, by way of example, disclosed in U.S. Pat. No. 5,768,176, which was owned by NEC Corporation. FIG. 20 illustrates a memory cell array 22a incorporated in the ferroelectric random access memory device. Four memory cells M11, M12, M21 and M22 form a part of the memory cell array 22a. Two rows of memory cells M11/M12 and M21/M22 are labeled with "WORD 0" and "WORD 1", respectively, and two columns of memory cells M11/M21 and M12/M22 are labeled with "BIT 0" and "BIT 1", respectively. The memory cell M11/M12/M21/M22 includes switching transistors TA1/TB1/TC1/TC1/TD1/TA2/TB2/TC2/TD2,TA3/TB3/TC3/TD3 and a ferroelectric capacitor FA/FB/FC/FD. The switching transistor TA1/TB1/TC1/TD1 and the switching transistor TA3/TB3/TC3/TD3 are connected in series between a bit line B0/B1 and the ground line, and the ferroelectric capacitor FA/FB/FC/FD is connected between the gate electrode of the switching transistor TA1/TB1/TC1/TD1 and a word lines F0/F1. The switching transistor TA2/TB2/TC2/TD2 is connected between a node CA/CB/CC/CD and a control line bias line D0/D1, and is gated by a control line C0/C1. The behavior of the memory cell M11/M12/M21/M22 is known to a person skilled in the art, and is not described in detail.

Though not shown in FIG. 20, dummy cells are provided around the memory cells, and are similar in structure to the memory cells M11/M12/M21/M22. The ferroelectric capacitors of the dummy cells are used as a compensating capacitor against the voltage fluctuation on an internal power distribution line in accordance with the present invention. The control line C0/C1 is divided into two parts, and an active voltage level is applied to the parts of the control lines C0/C1 connected to the gate electrodes of the switching transistors corresponding to the switching transistors TA2/TB2/TC2/TD2, and the switching transistors are turned on at all times. The word line F0/F1 is also divided into two parts, and the internal power distribution line is connected to the parts of the word lines F0/F1 connected to the capacitor electrodes of the ferroelectric capacitors. The other electrodes of the ferroelectric capacitors of the dummy cells may be grounded through the associated bias lines. In this instance, the ferroelectric capacitors of the memory cells such as M11 to M22 serve as storage capacitors for storing binary data bits in the form of voltage level.

What is claimed is:

1. A semiconductor memory device fabricated on a semiconductor substrate, comprising:

a plurality of memory cells arranged in a first area of a major surface of said semiconductor substrate in a certain geometric pattern for storing binary data bits in a readable and rewritable manner;

a plurality of dummy cells having a capacitance, said plurality of dummy cells arranged in second areas of said major surface contiguous to said first area so as to render said certain geometric pattern continued from said first area to said second areas;

electric circuits associated with said plurality of memory cells so as to write binary data bits into and read out said binary data bits therefrom; and an internal power source distributing an internal power voltage to said electric circuits, and connected to at least selected ones of said plurality of dummy cells so as to couple at least a part of said capacitance to said internal power source, thereby compensating voltage provided by said internal power source to said electrical circuits.

2. The semiconductor memory device as set forth in claim 1, in which said plural memory cells have respective storage capacitors for storing said binary data bits in the form of voltage level, and said plural dummy cells have respective dummy capacitors selectively connected to said internal power source and equal in dimensions to said storage capacitors for rendering said geometric pattern continued.

3. The semiconductor memory device as set forth in claim 2, in which said internal power source is connected to the dummy capacitors of said at least selected ones smaller in number than said plural dummy cells.

4. The semiconductor memory device as set forth in claim 2, in which said plural memory cells are dynamic random access memory cells, respectively.

5. The semiconductor memory device as set forth in claim 4, in which said dynamic random access memory cells and said dummy cells form one of memory cell arrays.

6. The semiconductor memory device as set forth in claim 5, in which said one of said memory cell arrays have a first counter electrode connected to a first constant voltage source and serving as parts of said storage capacitors of said dynamic random access memory cells and second counter electrodes connected to said internal power source and serving as parts of said dummy capacitors of said plural dummy cells.

7. The semiconductor memory device as set forth in claim 6, in which said storage capacitors and said dummy capacitors connected to said internal power source are connected in series to first transfer transistors and second transfer transistors, respectively, and the first transfer transistors of the memory cells in a row and the second transfer transistors of the dummy cells in said row have respective gate electrodes forming a first part of each sub-word line connected to a sub-word line driver and a second part of said each sub-word line applied with an active level so as to keep said second transfer transistors in on-state.

8. The semiconductor memory device as set forth in claim 6, in which storage capacitors and said dummy capacitors are connected in series to first transfer transistors of a normally off-type and second transfer transistors of a normally on-type, respectively, and each sub-word line serves as gate electrodes of the first transfer transistors in a row without providing any gate electrode of the second transfer transistors of the dummy cells in said row.

9. The semiconductor memory device as set forth in claim 5, in which said one of said memory cell arrays are associated with plural sub-word lines and plural bit lines, and said dynamic random access memory cells and said dummy cells respectively have generally rectangular impurity regions defined in said first area and said second areas and elongated in a direction parallel to said bit lines and perpendicular to said sub-word lines.

10. The semiconductor memory device as set forth in claim 5, in which said one of said memory cell arrays are associated with plural sub-word lines and plural bit lines, and said dynamic random access memory cells and said dummy cells respectively have generally rectangular impurity regions defined in said first area and said second areas and elongated in a direction oblique to said sub-word lines.

11. The semiconductor memory device as set forth in claim 1, in which said internal power source is further connected to a compensating capacitor.

12. The semiconductor memory device as set forth in claim 1, in which said plural memory cells and said plural dummy cells have storage capacitors for storing said binary data bits in the form of voltage level and dummy capacitors selectively connected to said internal power source and equal in dimensions to said storage capacitors for rendering said geometric pattern continued, respectively, and said internal power source is further connected to a compensating capacitor.

13. The semiconductor memory device as set forth in claim 12, in which the dummy capacitors connected to said internal power source are closer to selected ones of said electric circuits used for selecting one of said plural memory cells than said compensating capacitor.

14. The semiconductor memory device as set forth in claim 13, in which said selected ones of said electric circuits are at least a sub-word line driver unit, a sense amplifier unit, a row address decoder unit and a column address decoder and selector unit.

15. The semiconductor memory device as set forth in claim 13, in which said compensating capacitor is formed in a third area assigned to the other electric circuits and said internal power source.

* * * * *

UNITED STATES PATENT AND TRADEMARK OFFICE
CERTIFICATE OF CORRECTION

PATENT NO. : 6,438,052 B1
DATED : August 20, 2002
INVENTOR(S) : Sekine

It is certified that error appears in the above-identified patent and that said Letters Patent is hereby corrected as shown below:

Column 11,
Line 24, delete second "TCI"

Signed and Sealed this

First Day of June, 2004

JON W. DUDAS
*Acting Director of the United States Patent and Trademark Office*